(12) United States Patent
Wu et al.

(10) Patent No.: US 10,747,361 B2
(45) Date of Patent: Aug. 18, 2020

(54) CONTROL DEVICE AND CONTROL METHOD

(71) Applicant: DELTA ELECTRONICS, INC., Taoyuan (TW)

(72) Inventors: Tsung-Ting Wu, Taoyuan (TW); Si-Wei Chen, Taoyuan (TW)

(73) Assignee: DELTA ELECTRONICS INC., Taoyuan (TW)

( * ) Notice: Subject to any disclaimer, the term of this patent is extended or adjusted under 35 U.S.C. 154(b) by 0 days.

(21) Appl. No.: 16/459,588

(22) Filed: Jul. 1, 2019

(65) Prior Publication Data

US 2020/0142527 A1 May 7, 2020

(30) Foreign Application Priority Data

Nov. 7, 2018 (CN) .......................... 2018 1 1319408

(51) Int. Cl.
*G06F 3/041* (2006.01)
*G06F 1/26* (2006.01)
*G06F 1/3234* (2019.01)

(52) U.S. Cl.
CPC .............. *G06F 3/0416* (2013.01); *G06F 1/26* (2013.01); *G06F 1/3234* (2013.01)

(58) Field of Classification Search
CPC . G06F 3/0416; G06F 1/26; G06F 1/32; G06F 1/3234
See application file for complete search history.

(56) References Cited

U.S. PATENT DOCUMENTS

2015/0079914 A1\* 3/2015 Takahashi ............ H01Q 1/3283
455/127.2
2019/0302870 A1\* 10/2019 Tsukio ...................... G06F 1/26

\* cited by examiner

*Primary Examiner* — Dmitriy Bolotin
(74) *Attorney, Agent, or Firm* — CKC & Partners Co., LLC

(57) ABSTRACT

The control device includes a touch sensor circuit, a control circuit, a driving circuit and a switching circuit. The touch sensor circuit is configured to generate a touch signal and a function signal in response to a touch state of a touch component. The control circuit is activated by a first voltage. The control circuit selectivity generates a self-holding signal according to the function signal when it is activated. The driving circuit is configured to generate a drive signal according to the touch signal or the self-holding signal. The switch circuit is turned on by the drive signal so as to provide the first voltage to the control circuit by the turned-on switching circuit. When the control circuit generated the self-holding signal, the control circuit is configured to continuously transmit the self-holding signal to the driving circuit according to the function signal during a first enabling period.

15 Claims, 6 Drawing Sheets

CONTROL DEVICE AND CONTROL METHOD

RELATED APPLICATIONS

This application claims priority to China Application Serial Number 201811319408.X, filed Nov. 7, 2018, which is herein incorporated by reference in its entirety.

BACKGROUND

Field of Invention

The present of the disclosure relates to a control device and a control method. More particularly, the present disclosure relates to a power control circuit switching device and a control method thereof.

Description of Related Art

With the advancement of technology, single-function electronic devices have gradually developed into multi-function electronic devices, and most of the circuits require switching devices for powering on and off. Therefore, the application of switch control devices is becoming more and more extensive.

In the switch design of the electronic device, the touch switch element is often used as the start button, and when the user presses the touch switch, the electronic device can start the power supply to enter the normal operation state. The conventional touch switch may stop outputting the trigger signal when the user no longer presses, which may cause the electronic device to stop or interrupt the operation, which may cause inconvenience in use.

SUMMARY

One aspect of the present disclosure is a control device. The control device includes a touch sensor circuit, a control circuit, a driving circuit and a switching circuit. The touch sensor circuit is configured to generate a touch signal and a function signal in response to a touch state of a touch component. The control circuit is activated by a first voltage. The control circuit selectivity generates a self-holding signal according to the function signal when it is activated. The driving circuit is configured to generate a drive signal according to the touch signal or the self-holding signal. The switching circuit is coupled between a power source and the control circuit. The switch circuit is turned on by the drive signal so as to provide the first voltage to the control circuit by the turned-on switching circuit. When the control circuit generated the self-holding signal, the control circuit is configured to continuously transmit the self-holding signal to the driving circuit according to the function signal during a first enabling period.

Another aspect of the present disclosure is a control method. The control method includes following operations: (a) transmitting a touch signal and a function signal in response to a touch component of a touch state by a touch sensor circuit; (b) generating a drive signal according to the touch signal or a self-holding signal to turn on a power source between a control circuit and a switching circuit by a driving circuit, and the power source provide a first voltage to the control circuit by the switching circuit; (c) enabling the control circuit by the first voltage; (d) selectivity generating a self-holding signal according to the function signal when the control circuit is activated by the control circuit; (e) continuously transmitting the self-holding signal to the driving circuit according to the function signal during a first enabling period when the control circuit generates the self-holding signal by the control circuit.

DETAILED DESCRIPTION

It will be understood that, in the description herein and throughout the claims that follow, the terms "comprise" or "comprising," "include" or "including," "have" or "having," "contain" or "containing" and the like used herein are to be understood to be open-ended, i.e., to mean including but not limited to.

It will be understood that, in the description herein and throughout the claims that follow, the terms "coupled", "electrically coupled", "electrically connect" may indicate that two or more components being directly physically contacted or electrically contacted with each other, or indirectly physically contacted or electrically contacted with each other. That is, intervening elements may be present. Moreover, "electrically connect" or "connect" may further refer to the interoperation or interaction between two or more elements.

Figure 1:
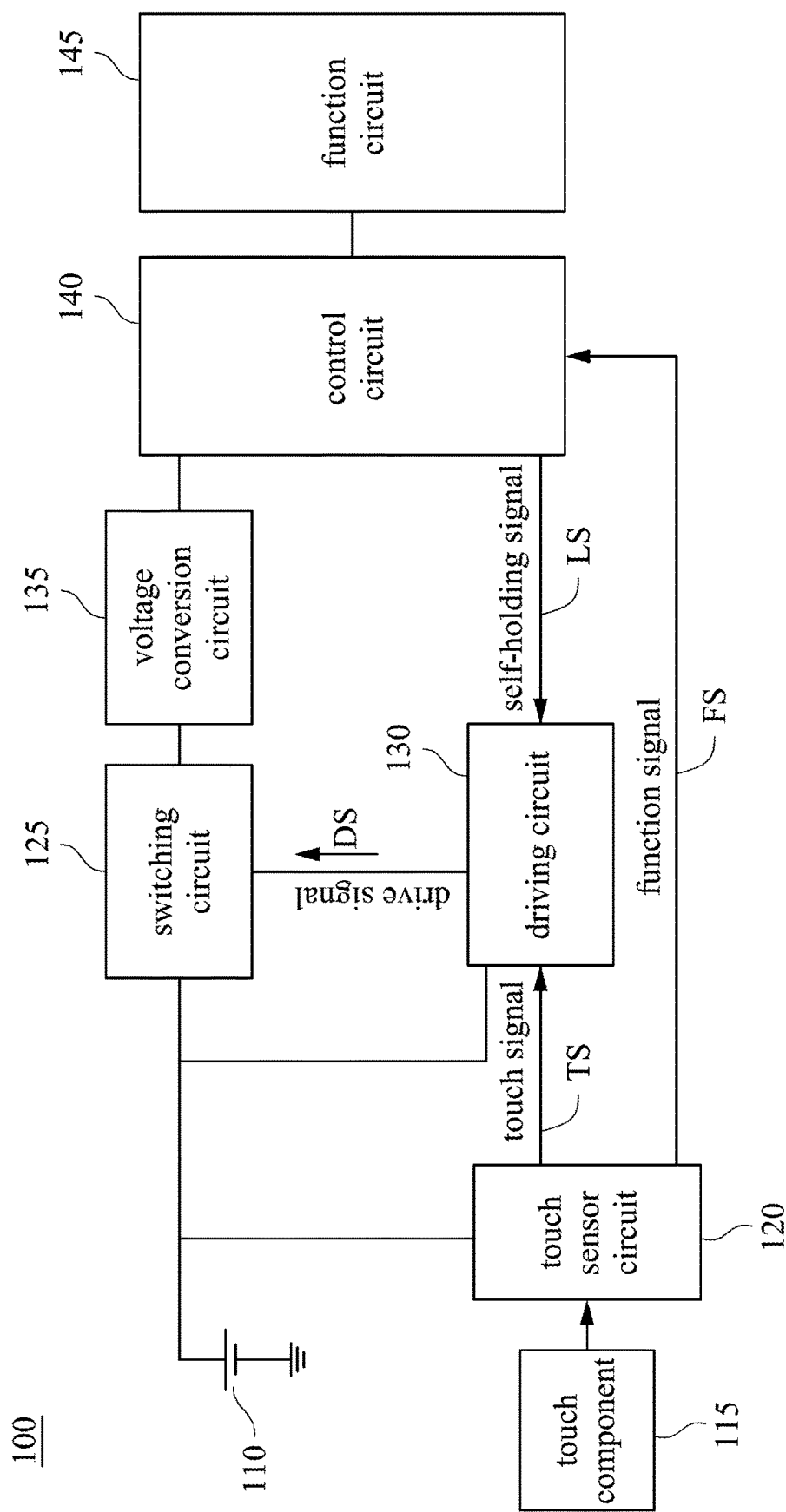
FIG. 1 is a function block diagram of a control device according to an embodiment of the present disclosure.

Referring to FIG. 1, FIG. 1 is a function block diagram of a control device according to an embodiment of the present disclosure. The control device 100 includes a power source 110, a touch component 115, a touch sensor circuit 120, a switching circuit 125, a driving circuit 130, a voltage conversion circuit 135, a control circuit 140 and a function circuit 145. The switching circuit 125 is coupled between the power source 110 and the voltage conversion circuit 135.

It should be noted that, the control device 100 is not limited to the above embodiment, and the connection relationship is also not limited to the above embodiment. Any connection method and implementation method sufficient for the control device 100 to implement the following technical contents can be applied to the present disclosure.

In an embodiment, when a user enables (e.g., touches or presses) the touch component 115, the touch sensor circuit 120 transmits a touch signal TS and a function signal FS in response to the touch state of the touch component 115. The touch signal TS is transmitted to the driving circuit 130, the function signal FS is transmitted to the control circuit 140. When the driving circuit 130 receives the touch signal TS, the driving circuit 130 will transmit a drive signal DS to the switching circuit 125 to turn on the switching circuit 125. When the switching circuit 125 is turned on, the power source 110 may output a first voltage to the voltage conversion circuit 135 by the switching circuit 125. When the voltage conversion circuit 135 receives the first voltage, the voltage conversion circuit 135 will convert the first voltage into a second voltage and transmit it to control circuit 140.

In an embodiment, the power source 100 may include various power sources, such as a battery, a generator, a power supply or other devices that can provide power. The voltage conversion circuit 135 may convert the voltages provided by different power sources into the first voltage required by the control circuit 140. For example, the voltage supplied by the power source may be 1.5V or 3.7V provided by the battery, 5V to 9V provided by the power supply, and 24V to 220V provided by the diesel generator. The voltage conversion circuit 135 is configured to convert it into the first voltage required by the control circuit 140, such as the system operating voltage of 5V to 15V. Thereby, the control device 100 may be compatible with voltages of various different input power specifications. After the control circuit 140 receives the first voltage, the control circuit 140 may drive the function circuit 145 coupled to the control circuit 140 with the first voltage, thereby activating the function circuit 145. In an embodiment, the function circuit 145 may be any circuit suitable for a switch control device. For example, the functional circuit 145 may be a doorbell or a flush controller.

In an embodiment, the touch component 115 may include a button, a switch, a touch panel or other touch or pressing device with control functions.

When the user touches or presses the touch component 115, the touch sensor circuit 120 will transmit the function signal FS to the control circuit 140, the control circuit 140 determines the time to transmit the self-holding signal LS to the driving circuit 130 according to the time or the number of times the function signal FS is received.

In an embodiment, the control circuit 140 may set a duration (for example, the duration of the control signal 140 received by the control circuit 140) or a number of consecutive reception (for example, the number of times the control circuit 140 receives the function signal FS during a signal reset cycle) as a threshold value. In operation, the control circuit 140 calculates the duration of receiving the function signal FS corresponding to the duration of a user enabling the touch component 115, and calculates the number of consecutive receiving times corresponding to the number of times the user continuously enables the touch component 115. The control circuit 140 determines whether to actuate a self-holding function according to the time or the number of times the function signal FS is received. For example, the control circuit 140 is provided with two sets of enabling durations being the first threshold time TH1 and the second threshold time TH2. For example, the first threshold time TH1 may be about 0.5 seconds, and the second threshold time TH2 may be about 3 second. When the user stops enabling the touch component 115 and the touch component 115 is enabled for less than the first threshold time TH1, at this time, the touch sensor circuit 120 stops generating the touch signal TS, and the control circuit 140 determines that the duration of receiving the function signal FS is less than the first threshold time TH1 and the control circuit 140 does not generate the self-holding signal LS. At this time, the driving circuit 130 does not receive the touch signal TS and the self-holding signal LS, and no longer transmits the drive signal DS to the switch circuit 125, so that the switch circuit 125 is turned off, and the control device 100 ends the operation.

When the control circuit 140 determines that the duration of receiving the function signal FS exceeds the first threshold time TH1 but does not reach the second threshold time TH2, the control circuit 140 generates the self-holding signal LS and transmits it to the driving circuit 130. At this time, even if the touch component 115 stops generating the touch signal TS, the driving circuit 130 may continue to turn on the switch circuit 125 according to the self-holding signal LS during the first enable period. That is, after the control device 100 starts the self-holding function, the control device 100 continues to be activated during the first enabling period, and powers the function circuit 145, so that the function circuit 145 may continuously perform the corresponding functional operation.

When the control circuit 140 determines that the duration of receiving the function signal FS exceeds the second threshold time TH2, the control circuit 140 continuously generates the self-holding signal LS and transmits it to the driving circuit 130. After the touch component 115 stops generating the touch signal TS, the driving circuit 130 still continues to turn on the switch circuit 125 according to the self-holding signal LS during the second enabling period. Namely, after the control device 100 starts the self-holding function, the control device 100 is continuously activated during the first enabling period, and supplies power to the function circuit 145. In addition, when the control circuit 140 determines that the duration of receiving the function signal FS exceeds the second threshold time TH2 (e.g. 3 seconds) the control device 100 is continuously activated during the second enabling period. In addition, the control circuit 140 may further trigger the function circuit 145 to start other additional functions.

In some applications, the control device 100 does not need to start the self-holding function, such as a push button switch, the circuit is activated when pressed, and the circuit is turned off after being released. The following uses a doorbell as an example.

In an embodiment, the function circuit 145 may be a doorbell or a ringing device, the touch component 115 may be a doorbell button, the first threshold time TH1 is set to 0.5 seconds, and the second threshold time TH2 is 3 seconds. The function that is greater than the first threshold time TH1 and less than the second threshold time TH2 is to extend the doorbell time to 3 seconds (the first enabling period), the function that is greater than the second threshold time TH2 is to broadcast a piece of music for 5 seconds (second enabling period).

When the user enables (e.g., touches or presses) the touch component 115 for a short period of time, such as pressing the doorbell once. Since the pressing time is less than 0.5 seconds of the first threshold time TH1, the control circuit 140 does not transmit the self-holding signal LS to the driving circuit 130. The control device 100 does not start the self-holding function. When the user stops pressing the doorbell, the touch sensor circuit 120 stops transmitting the touch signal TS and the function signal FS, and the driving circuit 130 stops transmitting the drive signal DS to the switch circuit 125. The switch circuit 125 is turned off, and the control device 100 ends the operation. In this embodiment, the user only needs to make the doorbell ring once, the control device 100 does not need to activate the self-holding function.

In some applications, the control device 100 needs to turn on the self-holding function to cause the function circuit 145 to continue to boot. The following is an example of extending the doorbell time.

When the user needs to extend the doorbell ringing time, the user continues to press the doorbell for 2 seconds and then stops pressing the doorbell. At this time, the control circuit 140 receives the function signal FS for 2 seconds, that is greater than the first threshold time TH1 and less than the second threshold time TH2, the control device 100 turns on the self-holding function, and the control circuit 140 transmits the self-holding signal LS to the driving circuit 130 for 3 seconds and causes the control device 100 to extend the start time by 3 seconds. After the user stops pressing the doorbell, the doorbell is stopped for an additional 3 seconds due to the self-holding function.

In some applications, in addition to extending the time, additional features are required. The following is an example of the case where the doorbell is unresponsive.

After the doorbell is extended and the owner has not responded, when the user continues to press the doorbell for 4 seconds and stop pressing the doorbell. Since 4 seconds is greater than the second threshold time TH2, the control device 100 activates the self-holding function and turns on the function of broadcasting a 5-second music. The control circuit 140 transmits the self-holding signal LS to the driving circuit 130 for 5 seconds so that the control device 100 extends the starting time for 5 seconds. After the user stops pressing the doorbell, the doorbell is additionally played for 5 seconds since the self-holding function.

According to the description of the above embodiment, the self-holding function of the control device 100 may extend the time when the homeowner hears the doorbell, and the user does not need to continuously press the doorbell. The user can determine the pressing time according to the actual application requirement to start different functions.

In some applications, it is more convenient for the user to continuously enable the touch component 115. The control circuit 140 may simultaneously set the duration of receiving the function signal FS and the number of receptions as the threshold value. The first threshold time TH1 and the second threshold number TF2 are set by the flush control of the toilet as an example.

In an embodiment, the function circuit 145 may be a flush controller of the toilet, and the touch component 115 may be a flush button, the first threshold time TH1 is set to 1 second, and the second threshold number TF2 is set to 2 times. When the time for pressing the flush button is less than the first threshold time TH1, the self-holding function is not turned on, and the flushing is stopped after the flush button is released. When the time for pressing the flush button is greater than the first threshold time TH1, the self-holding function is turned on to extend the flushing time to 3 seconds (the first enabling period). After the self-holding function is turned on, when the control circuit 140 receives the function signal FS twice or more during a signal reset cycle, the operation continues during the second enabling period. That is, when the self-holding function is turned on and the user continuously presses the flush button twice or more, the flushing time is extended to 5 seconds (the second enabling period). In an embodiment, the function when the user continuously presses the flush button twice may also be to enhance the flushing intensity or other functions.

Figure 2:
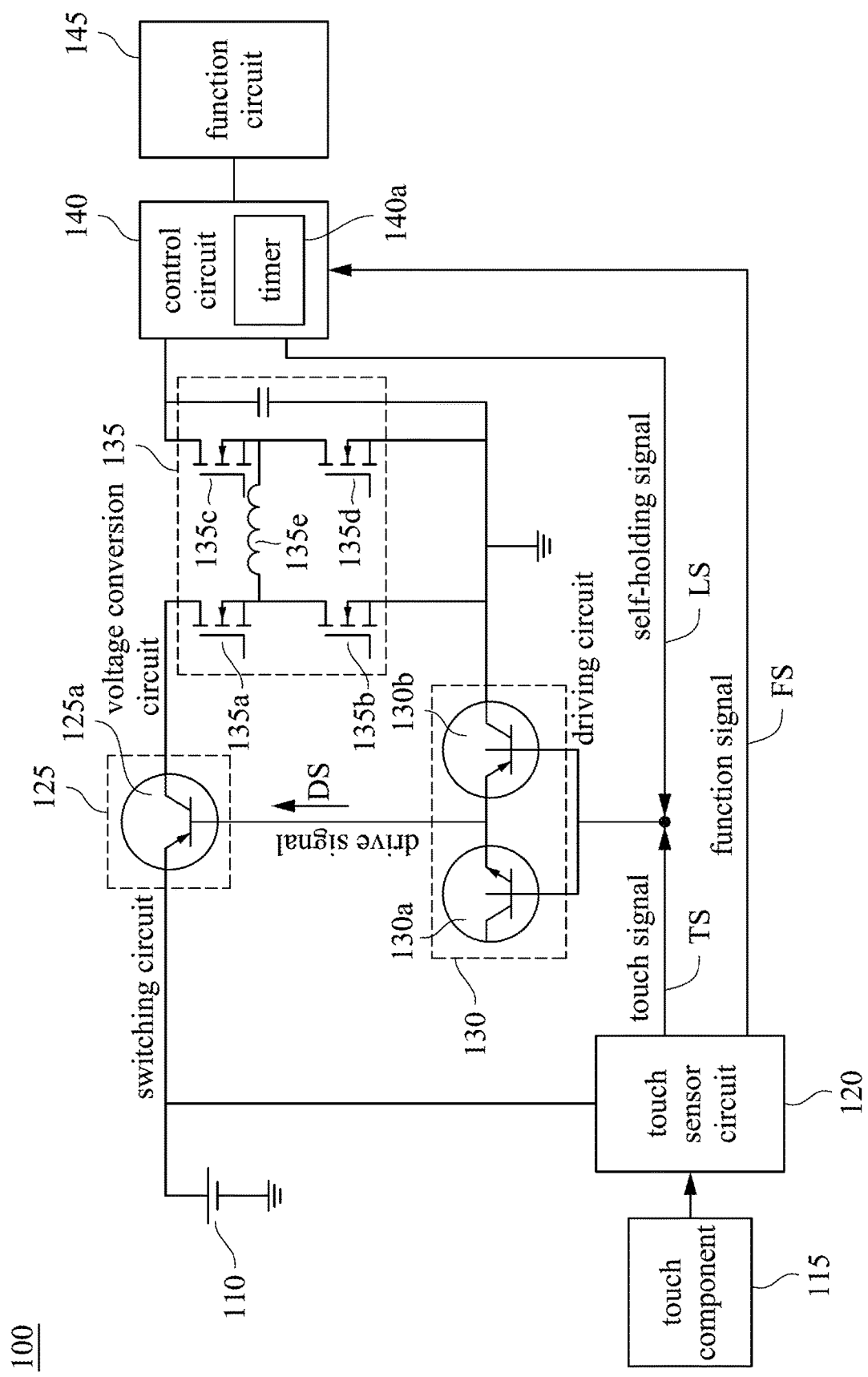
FIG. 2 is a partial circuit diagram of a control device according to an embodiment of the present disclosure.

Referring to FIG. 2, FIG. 2 is a partial circuit diagram of a control device according to an embodiment of the present disclosure. The switch circuit 125 includes a transistor 125a. The drive circuit 130 includes a transistor 130a and a transistor 130b. The voltage conversion circuit 135 includes a transistor 135a, a transistor 135b, a transistor 135c, a transistor 135d, and a capacitor 135e. The control circuit includes a timer 140a. The driving circuit 130 can enhance the drive signal outputted by the touch sensor circuit 120 or the self-holding signal LS outputted by the control circuit 140 to improve the drive capability, it uses the transistors 130a and 130b in series to introduce the power of the power source 110. The timer 140a in the control circuit 140 is configured to calculate the duration or the number of times of receiving the function signal FS and the time to transmit the self-holding signal LS. The control circuit 140 can calculate whether the time for receiving the function signal FS is greater than or equal to the set first threshold time TH1 or the second threshold time TH2 by the timer 140a and determine when to transmit the self-holding signal LS, or calculate whether the number of times of the receiving function signal FS is greater than or equal to the set first threshold number TF1 or the second threshold number TF2 in a signal reset cycle.

Figure 3:
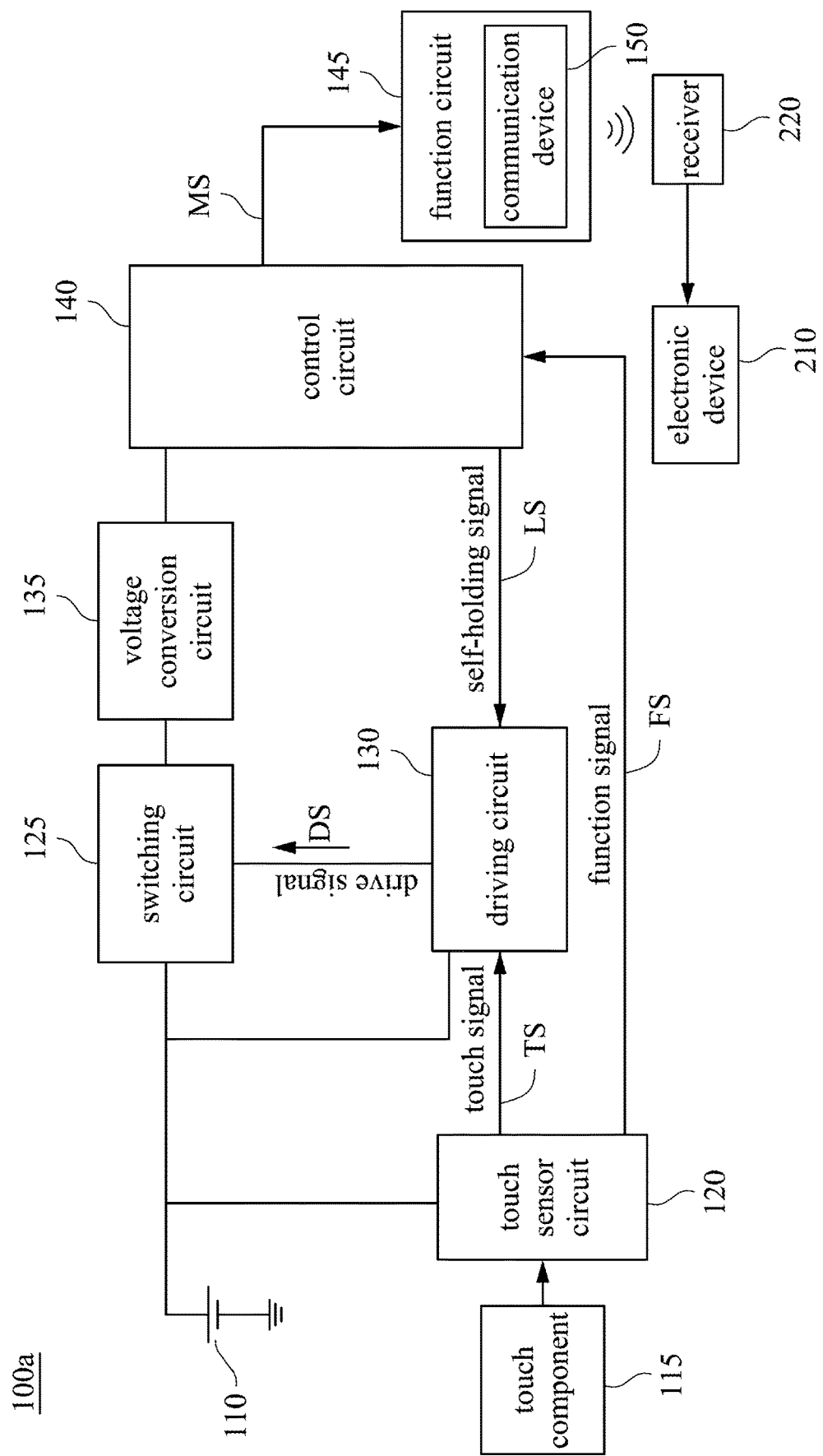
FIG. 3 is a function block diagram of a control device according to another embodiment of the present disclosure.

Referring to FIG. 3, FIG. 3 is a function block diagram of a control device according to another embodiment of the present disclosure. The control circuit 140 in the control device 100a may transmit the match signal MS to the function circuit 145. In the embodiment of FIG. 3, the function circuit 145 includes a communication device 150 for transmitting signals to the external device. For example, the communication device 150 may include an infrared emitter, a Bluetooth transmitter, a Zigbee transmitter, or other regional wireless signal transmitter. The communication device 150 is configured to pair with the receiver 220 of the external electronic device 210. The communication device 150 may communicate with the receiver 220, and the receiver 220 transmits the received signal to the electronic device 210. For example, the electronic device 210 may be a home appliance such as a television, an air conditioner, an electric fan or other devices, or another electronic device having a receiver 220 for receiving a signal.

In an embodiment, the control device 100a in FIG. 3 may be a home energy management system or a multi-function remote control for controlling various appliances, and the touch component 115 may be a touch panel. When the user controls the other electrical appliances via the control device 100a and enables the touch component 115 of the control device 100a to be greater than the second threshold time TH2 (for example, when the touch panel is pressed for more than 5 seconds), at this time, after the control circuit 140 in the control device 100a determines that the time for receiving the function signal FS is greater than the second threshold time TH2, the control circuit 140 transmits the self-holding signal LS to the driving circuit 130, and the control circuit 140 transmits the match signal MS to the communication device 150 in the function circuit 145, the communication device 150 wirelessly transmits infrared, Bluetooth, Zigbee or other wireless communication signals to the receiver 220, and after the receiver 220 is triggered, the electronic device 210 is turned on, for example, the television in the home could be turned on.

Figure 4:
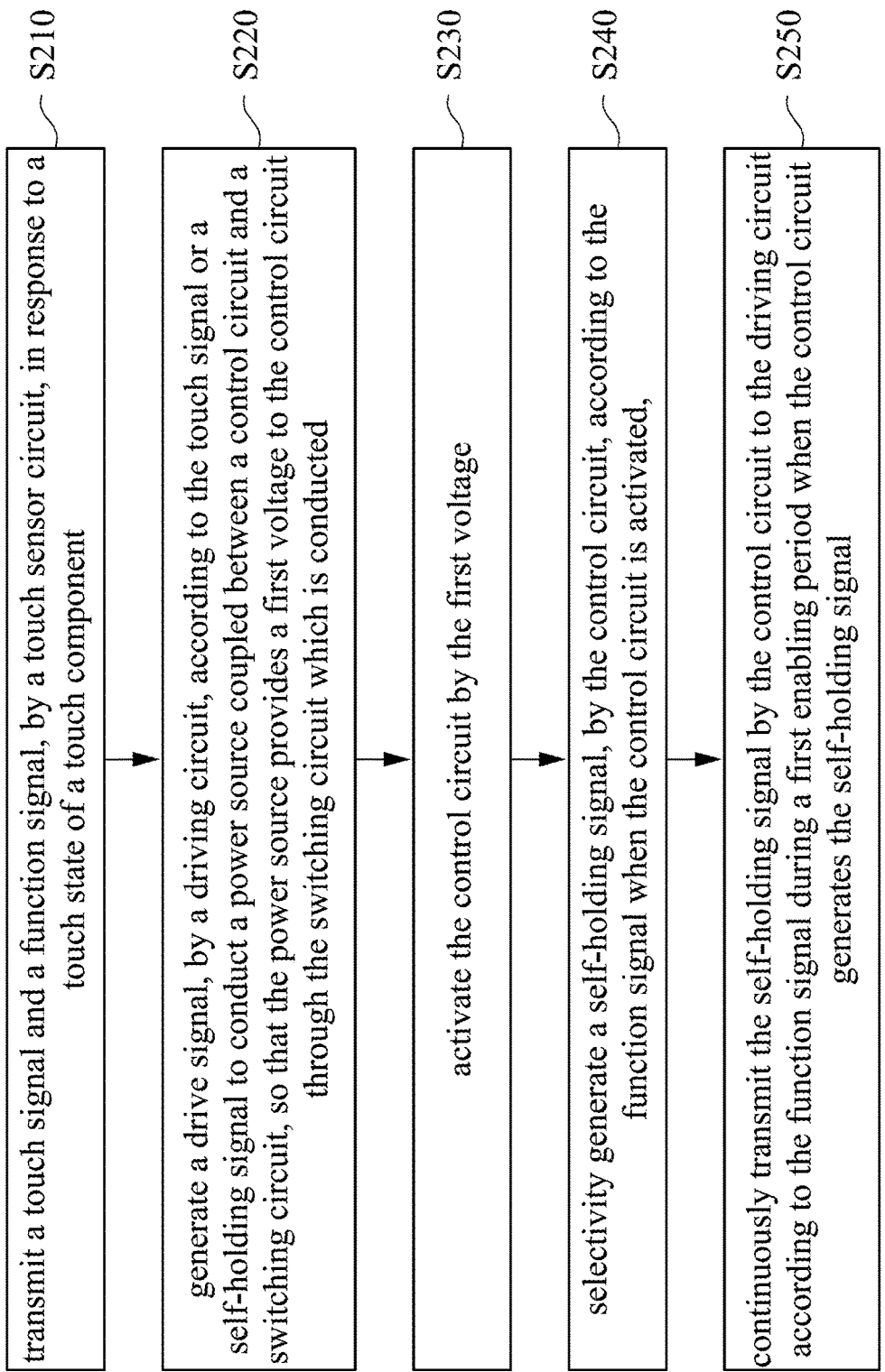
FIG. 4 is a flow chart of a control method according to an embodiment of the present disclosure.

Referring to FIG. 4, FIG. 4 is a flow chart of a control method according to an embodiment of the present disclosure. In step S210, the touch sensor circuit 120 responds to the touch state of the touch component 115, the touch state includes touching or pressing, and transmitting the touch signal TS and the function signal FS. In step S220, the drive signal DS is generated by the driving circuit 130 according to the touch signal TS to turn on the switching circuit 125 coupled between the power source 110 and the control circuit 140, so that the power source 110 supplies the first voltage to the control circuit 140 via the turned-on switching circuit 125. In step S230, the power source 110 provides the first voltage to enable the control circuit 140 via the switch circuit 125 that has been turned on. In step S240, when the control circuit 140 is enabled, the self-holding signal LS is selectively generated by the control circuit 140 according to the received function signal FS. In step S250, the control circuit 140 calculates the time or the number of times the function signal FS is received, and continuously transmits the self-holding signal LS to the driving circuit 130 during the first enabling period.

Figure 5:
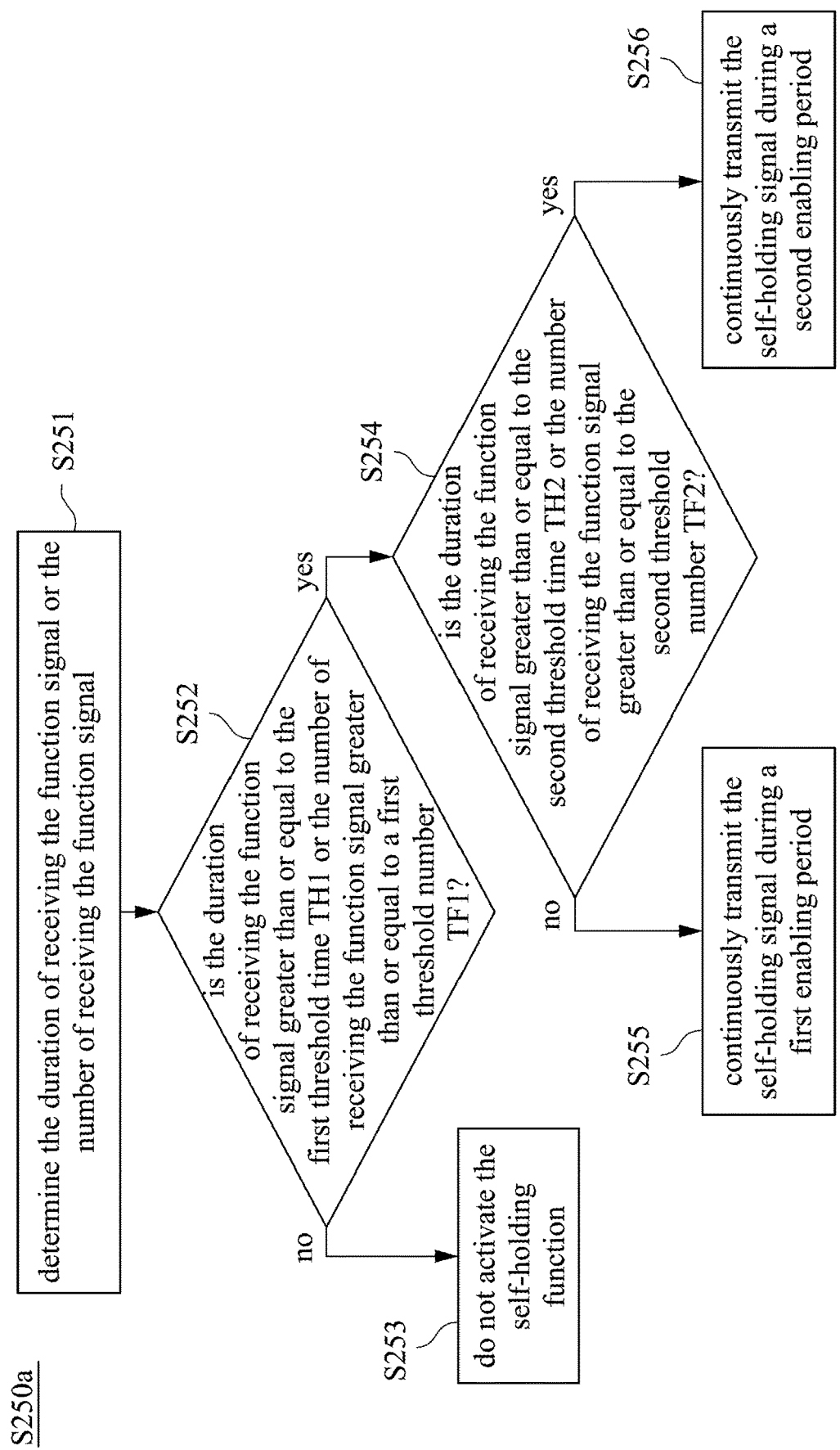
FIG. 5 is a detailed flow chart of the control method of FIG. 4 according to some embodiments.

Referring to FIG. 5, FIG. 5 is a detailed flow chart of the control method of FIG. 4 according to some embodiments. Step S250a shown in FIG. 5 is one of the aspects of step S250 in FIG. 4. Step S250a includes step S251-step S256. In step S251, the control circuit 140 calculates the duration or number of receptions that the control circuit 140 receives the function signal FS. In step S252, The control circuit 140 determines whether the time when the function signal FS is received is greater than the first threshold time TH1 or whether the number of receptions is greater than the first threshold number TF1. If it is less than the first threshold time TH1 or less than the first threshold number TF1, then skipping to step S253 and does not turn on the self-holding function. If it is greater than the first threshold time TH1 or greater than the first threshold number TF1, the control device 100 starts the self-holding function, and determines whether the time or the number of times the function signal FS is received is greater than the second threshold time TH2 or greater than the second threshold number TF2. If it is less than the second threshold time TH2 or less than the second threshold number TF2, the process jumps to step S255, and the control circuit 140 continues to transmit the self-holding signal LS during the first enabling period. If it is determined in step S254 that the second threshold time TH2 is greater than or greater than the second threshold number TF2, then the process goes to step S256, and the self-holding signal LS is continuously transmitted during the second enabling period.

Namely, when the duration of receiving the function signal FS is less than the first threshold time TH1 or the number of receptions is less than the first threshold number TF1, the control device 100 does not starts the self-holding function. When the duration of the receiving function signal FS is greater than the first threshold time TH1 and less than the second threshold time TH2 or the number of receptions is greater than the first threshold number TF1 and less than the second threshold number TF2, the self-holding function is turned on, and during the first enabling period The internal control circuit 140 continuously transmits the self-holding signal LS. When the duration of receiving the function signal FS is greater than the second threshold time TH2 or the number of receptions is greater than the second threshold number TF2, the control circuit 140 continues to transmit the self-holding signal LS during the second enabling period.

Figure 6:
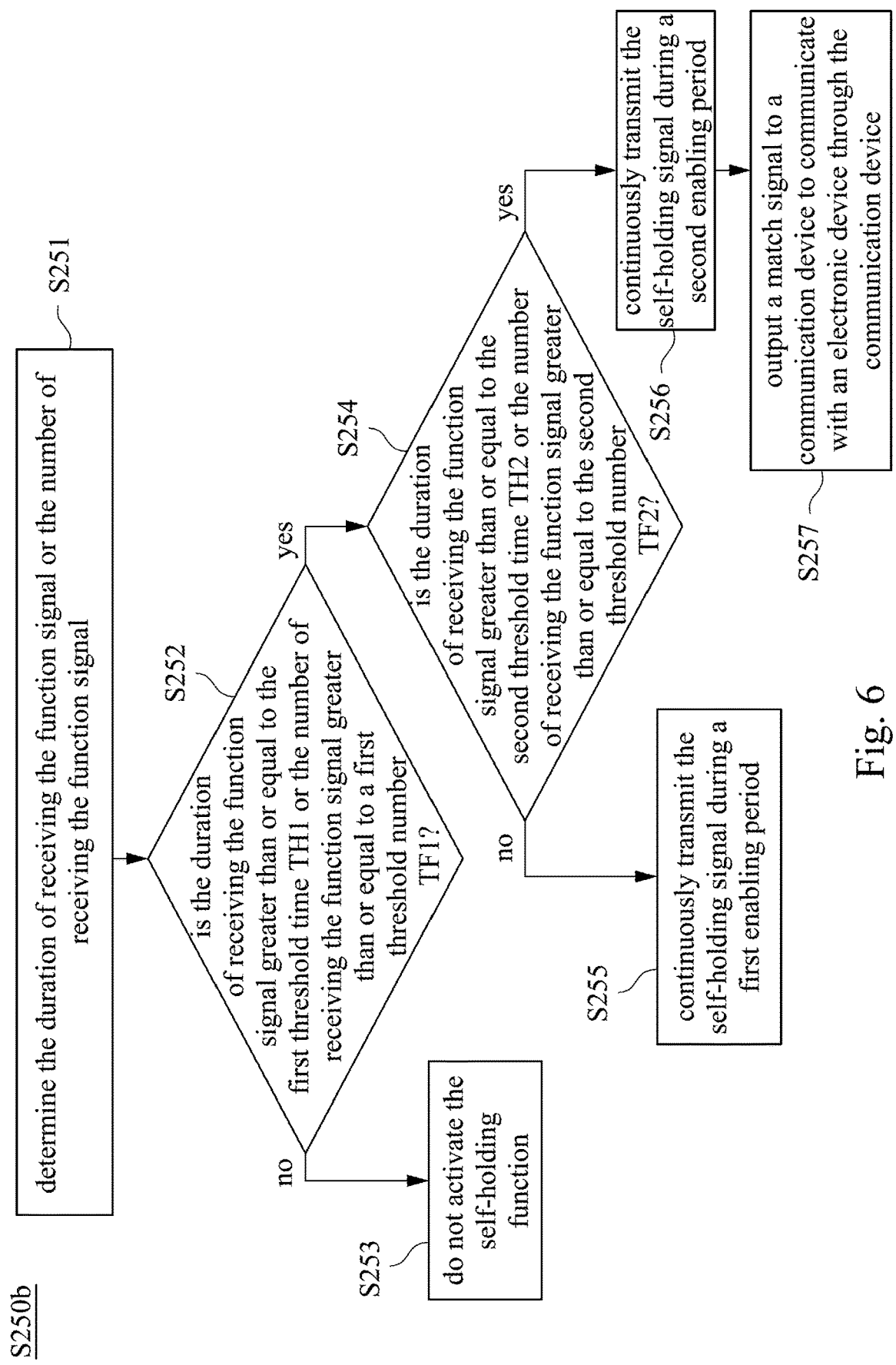
FIG. 6 is a detailed flow chart of the control method of FIG. 4 according to some embodiments.

Referring to FIG. 6, FIG. 6 is a detailed flow chart of the control method of FIG. 4 according to some embodiments. Step S250b shown in FIG. 6 is another aspect of step S250 in FIG. 4, step S250b includes step S251-step S257. Steps S251 to S256 are similar to the above description of FIG. 5, and details are not described herein again. When the control device 100a continuously transmits the self-holding signal LS during the second enabling period, the control circuit 140 outputs the match signal MS to the communication device 150 in the function circuit 145, and communicates with the electronic device 210 by the communication device 150.

Through the operation of the above embodiment, the control device can start the self-holding function according to the touch state of the touch component, extend the required function, and open different functions according to different durations or times of pressing or touching. Automatically shut down after a certain time to achieve energy saving. The control device is suitable for electronic devices of various power supply specifications and can convert voltages of different power supply specifications into required input voltages.

Reference will now be made in detail to the present embodiments of the disclosure, examples of which are illustrated in the accompanying drawings. It will be apparent to those skilled in the art that after understanding the embodiments of the present disclosure, various modifications and variations can be made based on the teaching of the disclosure without departing from the scope or spirit of the disclosure.

What is claimed is:

1. A control device, comprising:
   a touch sensor circuit, configured to generate a touch signal and a function signal in response to a touch state of a touch component;
   a control circuit, activated by a first voltage, and configured to selectivity generate a self-holding signal according to the function signal when the control circuit is activated;
   a driving circuit, configured to generate a drive signal according to the touch signal or the self-holding signal; and
   a switching circuit, coupled between a power source and the control circuit, and configured to be conducted by the drive signal so that the power source provides the first voltage to the control circuit through the conducted switching circuit,
   wherein when the control circuit generates the self-holding signal, the control circuit is configured to continuously transmit the self-holding signal to the driving circuit according to the function signal during a first enabling period.

2. The control device of claim 1, wherein the control circuit determines whether to generate the self-holding signal according to a duration or a number of receiving the function signal.

3. The control device of claim 2, wherein the control circuit generates the self-holding signal when the duration of receiving the function signal is greater than or equal to a first threshold time, or when the number of receiving the function signal is greater than or equal to a first threshold number.

4. The control device of claim 3, wherein the control circuit is further configured to continuously transmits the self-holding signal to the driving circuit during a second enabling period when the duration of receiving the function signal is greater than the first threshold time and the duration of receiving the function signal is greater than or equal to a second threshold time, wherein the second enabling period is greater than the first enabling period.

5. The control device of claim 4, wherein the control device further comprises:
   a communication device, wherein the control circuit is further configured to output a match signal to the communication device to communicate with an electronic device through the communication device when the duration of receiving the function signal is greater than or equal to the second threshold time.

6. The control device of claim 3, wherein the control circuit is configured to continuously transmit the self-holding signal to the driving circuit during a second enabling period when the number of receiving the function signal is greater than the first threshold number and the number of receiving the function signal is greater than or equal to a second threshold number in a signal reset cycle, wherein the second enabling period is greater than the first enabling period.

7. The control device of claim 6, wherein the control circuit further comprises:
a communication device, wherein the control circuit is configured to output a match signal to the communication device to communicate with an electronic device through the communication device when the number of receiving the function signal is greater than or equal to the second threshold number.

8. The control device of claim 1, further comprising:
a voltage conversion circuit, coupled between the switching circuit and the control circuit, wherein the voltage conversion circuit is configured to convert the first voltage provided by the power source and provide the converted first voltage to the control circuit to enable the control circuit.

9. A control method, comprising:
(a) transmitting a touch signal and a function signal, by a touch sensor circuit, in response to a touch state of a touch component;
(b) generating a drive signal, by a driving circuit, according the touch signal or a self-holding signal to conduct a power source coupled between a control circuit and a switching circuit, so that the power source provides a first voltage to the control circuit through the conducted switching circuit;
(c) activating the control circuit by the first voltage;
(d) selectivity generating the self-holding signal, by the control circuit, according to the function signal when the control circuit is activated; and
(e) continuously transmitting the self-holding signal to the driving circuit, by the control circuit, according to the function signal during a first enabling period when the control circuit generates the self-holding signal.

10. The control method of claim 9, wherein the step (d) comprises:
determining whether to generate the self-holding signal according to a duration or a number of receiving the function signal.

11. The control method of claim 10, wherein the step (d) further comprises:
generating the self-holding signal when the duration of receiving the function signal is greater than or equal to a first threshold time, or when the number of receiving the function signal is greater than or equal to a first threshold number.

12. The control method of claim 11, wherein the step (e) further comprises:
continuously transmitting the self-holding signal to the driving circuit during a second enabling period when the duration of receiving the function signal is greater than the first threshold time and the duration of receiving the function signal is greater than or equal to a second threshold time, wherein the second enabling period is greater than the first enabling period.

13. The control method of claim 12, wherein the step (e) further comprises:
outputting a match signal to a communication device to communicate with an electronic device through the communication device when the number of receiving the function signal is greater than or equal to the second threshold time.

14. The control method of claim 11, wherein the step (e) further comprises:
continuously transmitting the self-holding signal to the driving circuit during a second enabling period when the number of receiving the function signal is greater than the first threshold number and the number of receiving the function signal is greater than or equal to a second threshold number in a signal reset cycle, wherein the second enabling period is greater than the first enabling period.

15. The control method of claim 14, wherein the step (e) further comprises:
outputting a match signal to a communication device to communicate with an electronic device through the communication device when the number of receiving the function signal is greater than the first threshold number and the number of receiving the function signal is greater than or equal to the second threshold number.

* * * * *